United States Patent [19]
Cox et al.

[11] Patent Number: 5,732,333
[45] Date of Patent: Mar. 24, 1998

[54] LINEAR TRANSMITTER USING PREDISTORTION

[75] Inventors: Charles Brian Cox; David Kent Bonds, both of Quincy, Ill.; Jay Jui-Chieh Chen, Vancouver; Flaviu C. Costescu, Surrey, both of Canada; Joel Richard Dierks, Quincy, Ill.; Wayne Douglas Duello, Quincy, Ill.; Thomas L. Frederick, Liberty, Ill.; Paul A. Goud, Vancouver; Derek Stephen Hilborn, Nepean, both of Canada; Richard Johnathan Hinkle, Taylor; Terry Lee Hinkle, Lewistown, both of Mo.; David E. Jones; Theron Lee Jones, both of Quincy, Ill.; Patricia Fern Kavanagh, Burnaby, Canada; David W. Kroeger, Quincy, Ill.; Robert Richard Leyendecker, Blaine, Wash.; Vladimir Pavlovic, Vancouver; Claudio Gustavo Rey, Coquitlam, both of Canada; Ray M.R. Sewlochan, Vancouver; Emre Tapucu, Burnaby, both of Canada; Mark A. Walker, Palmyra, Mo.

[73] Assignee: Glenayre Electronics, Inc., Charlotte, N.C.

[21] Appl. No.: 601,118

[22] Filed: Feb. 14, 1996

[51] Int. Cl.⁶ .................... H04B 1/04; H03F 1/26
[52] U.S. Cl. .................... 455/126; 455/129; 330/149; 375/296
[58] Field of Search .................... 455/113, 116, 455/119, 126, 129, 114, 115; 330/149, 136; 375/296, 297

[56] References Cited

U.S. PATENT DOCUMENTS 4,291,277  9/1981  Davis et al. .
4,591,800  5/1986  Opas .
4,700,151  10/1987  Nagata ........................ 330/149
4,879,519  11/1989  Myer .

(List continued on next page.)

FOREIGN PATENT DOCUMENTS 62-139425  6/1987  Japan ........................ 455/126

Primary Examiner—Reinhard J. Eisenzopf
Assistant Examiner—Sam Bhattacharya
Attorney, Agent, or Firm—Christensen, O'Connor, Johnson & Kindness PLLC

[57] ABSTRACT

A linear transmitter (101) using predistortion includes a modulator (103), a predistorter (107), a digital quadrature modulator (111), an upconverter (113), a power amplifier (115), and an antenna (117). In addition, the transmitter (101) has a feedback loop including a coupler (119), a downconverter (123), a digital quadrature demodulator (125), and a trainer (131). The digital data to be transmitted is provided into the modulator (103), which converts the digital data into in-phase and quadrature component signals. The in-phase and quadrature component signals are then provided to the predistorter (107), which "predistorts" the component signals prior to amplification. The digital quadrature modulator (111) converts the component signals into a single analog signal. The upconverter (113) upconverts this signal from the predistorter (107) into the desired frequency of transmission, which is provided to the power amplifier (115) and the antenna (117) for amplification and broadcast. The coupler (119) provides a portion of the amplified signal to the analog downconverter (123), which lowers the frequency of this signal to a range that is easily processed. The signal is then provided to the digital quadrature demodulator (125), which outputs the in-phase and quadrature component signals of the signal. These in-phase and quadrature component signals are provided to the trainer (131) which analyzes them with the output signals from the modulator. The trainer (131) compares these signals and updates the predistorter (107) so that the digital quadrature demodulator (125) output signals are substantially equivalent to the modulator (103) output signals.

35 Claims, 6 Drawing Sheets

U.S. PATENT DOCUMENTS

| | | |
|---|---|---|
| 4,890,300 | 12/1989 | Andrews . |
| 5,023,937 | 6/1991 | Opas . |
| 5,049,832 | 9/1991 | Cavers . |
| 5,105,164 | 4/1992 | Fisher et al. . |
| 5,132,634 | 7/1992 | Suarez ................................... 455/126 |
| 5,134,718 | 7/1992 | Gailus . |
| 5,148,448 | 9/1992 | Karam et al. ........................ 455/126 |
| 5,193,224 | 3/1993 | McNicol et al. ..................... 455/126 |
| 5,249,201 | 9/1993 | Posner et al. . |
| 5,262,734 | 11/1993 | Dent et al. . |
| 5,418,818 | 5/1995 | Marchetto et al. . |
| 5,420,536 | 5/1995 | Faulkner et al. . |
| 5,430,416 | 7/1995 | Black et al. . |
| 5,507,014 | 4/1996 | Wray et al. ........................... 455/126 |

5,732,333

LINEAR TRANSMITTER USING PREDISTORTION

FIELD OF THE INVENTION

This invention relates to linear transmitters, and more particularly, to linear paging transmitters utilizing predistortion.

BACKGROUND OF THE INVENTION

It is well-known that the power amplification stages of typical broadcast transmitters behave in a nonlinear fashion when operated near peak capacity. One simple solution to this problem is to "back off" the power amplifier and only operate the power amplifier below saturation in its linear region. However, backing off the power amplifier tends to reduce the power conversion efficiency of the power amplifier. Additionally, for a given required transmitter output power, the power amplifier used must be larger (and more expensive) than a power amplifier that can be operated at peak capacity.

Furthermore, although backing off would allow the power output of the power amplifier to behave more linearly, backing off would not alleviate the phase distortion of the power amplifier. For modulation schemes that only depend upon modulation of amplitude (such as AM), phase distortion is of relatively little concern. However, for other types of modulation schemes that rely upon both amplitude and phase modulation, phase distortion is an important concern.

In order to provide high speed data rates, some conventional systems use modulation schemes such as quadrature amplitude modulation (QAM). As is known in the art, QAM relies upon the transmitter being able to vary both the phase and amplitude of the transmitted signal. Unfortunately, power amplification stages that perform nonlinearly generally have extreme difficulty in implementing the QAM scheme efficiently and effectively.

One result of nonlinear amplification stages with QAM schemes is that undesirable intermodulation products (IMPs) typically are generated. The intermodulation products manifest themselves as spurious emissions that lie both inside and outside of the desired transmitter channel. These emissions are unacceptable for two reasons. First, governmental entities, such as the Federal Communication Commission (FCC) require that spurious emissions out of an assigned channel be a predetermined level lower (usually indicated as a dB level down from peak output) than the main central channel. Secondly, by having intermodulation products, energy is lost in transmitting signals that will not be received by a receiving unit, such as a pager or a cellular phone. Thus, nonlinearities in the power amplification stages of a transmitter inefficiently utilize power and fail to meet the requirements of the FCC for adjacent channel emissions. This problem has been recognized in the prior art as seen in U.S. Pat. No. 4,291,277 issued to Davis et al. on Sep. 22, 1981.

Typical conventional predistorter schemes use analog quadrature modulators and demodulators with separate in-phase and quadrature signal analog-to digital (A-D) and digital-to-analog (D-A) converters. Such analog systems require analog carrier signals that are equal in amplitude and have a 90° relative phase difference. However, among other disadvantages, these analog carrier signals are subject to drift or variation over time and temperature. Any imbalance between the carrier signals in amplitude or phase difference can cause unwanted sideband and carrier regeneration, as well as other higher order products in the output signal spectrum. These errors typically degrade the operation of predistortion schemes. Similarly, any relative delay or amplitude imbalance in the in-phase and quadrature baseband introduced by the quadrature modulation or demodulation process or any intervening stages also degrade the operation of predistortion schemes. Thus, the baseband signals are typically mismatched to some degree in delay and scaling, thereby degrading the performance of the system.

Further, some conventional predistortion schemes require that the transmitter transmit special data sequences to properly train the trainer. In these systems, the special data sequence are periodically transmitted to update the trainer and predistorter. Thus, when these special data sequences are transmitted, normal data or voice transmissions cannot be sent, thereby reducing the transmitter's throughput. Moreover, these data sequences may cause the transmitter to violate the spectral requirements of the FCC.

Still further, typical conventional transmitters with predistortion, on power up, may transmit spurious out-of-band signals while initially training the system. Typically, these transmitters transmit a special training sequence upon power up, which can cause these spurious signals. Consequently, these transmitters do not transmit normal data or voice signals immediately after power up, but instead must wait for the "initialization" to complete.

In addition, typical conventional paging transmitters, once implemented, cannot be easily reconfigured. Paging formats and predistortion schemes are constantly being improved and updated and, thus, there is a need for these transmitters to be easily reconfigured with these new formats and schemes. Typical conventional paging transmitters cannot support such reconfiguration on a commercial scale.

The present invention is directed towards a reconfigurable transmitter that will operate linearly with various modulation schemes, including those that vary the amplitude and phase of the transmitted signal. The present invention is also directed toward overcoming the disadvantages of analog modulation and other disadvantages of the prior art.

SUMMARY OF THE INVENTION

The present invention is directed towards a linear transmitter using predistortion and adaptive monitoring to continuously update the predistortion of the transmitter. The transmitter includes a modulator, a predistorter, a digital quadrature modulator, a digital-to-analog converter, an analog upconverter, and a power amplifier. In addition, the transmitter has a feedback loop including a coupler, an analog downconverter, an analog-to-digital converter, a digital quadrature demodulator, and a trainer.

In operation, the modulator receives digital data that is to be transmitted and converts the digital data into in-phase and quadrature component signals. The in-phase and quadrature component signals are then provided to the predistorter which multiplies the component signals by a varying complex gain (a+jb), such that when they are subsequently passed through the power amplifier the signals will appear as close as possible to the desired modulated signal, without distortion. The signals from the predistorter are received by the digital quadrature modulator, which outputs a single real digital signal. The real digital signal is converted to a real analog signal by the digital-to-analog converter. The real analog signal is upconverted into the desired frequency of transmission by the analog upconverter, and the upconverted signal is then provided to the power amplifier for transmission.

In the feedback loop, the coupler provides a portion of the output signal of the power amplifier (i.e., the receive signal) to the analog downconverter, which lowers the frequency of the receive signal to a range that is easily processed. The downconverted signal is then provided to the analog-to-digital converter for conversion to a digital signal. The digital signal from the analog-to-digital converter is received by the digital quadrature demodulator, which outputs the in-phase and quadrature component signals of the demodulated signal to the trainer. The trainer also receives the in-phase and quadrature component signals from the modulator. The trainer analyzes the demodulated signal's in-phase and quadrature component signals with the in-phase and quadrature component signals provided by the modulator and estimates and updates the predistorter varying the complex gain so that the transmitter output signal (as demodulated by the digital quadrature demodulator) is maintained substantially equivalent to digital data to be transmitted (as modulated by the digital modulator).

According to another embodiment of the present invention, a controller interface of the modulator, the digital quadrature modulator and the digital quadrature demodulator include reprogrammable devices which can be reconfigured by a controller. Thus, these elements can be selectably reconfigured to modify the modulation formats and other functions. The modulator, predistorter, trainer and digital downconverter are implemented in software controlled digital signal processing (DSP) devices that can be reconfigured to modify their functions. In a further refinement, the controller is coupled to receive configuration information remotely communicated to the controller so that the transmitter can be reconfigured from a remote location.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF A PREFERRED EMBODIMENT

Figure 1:
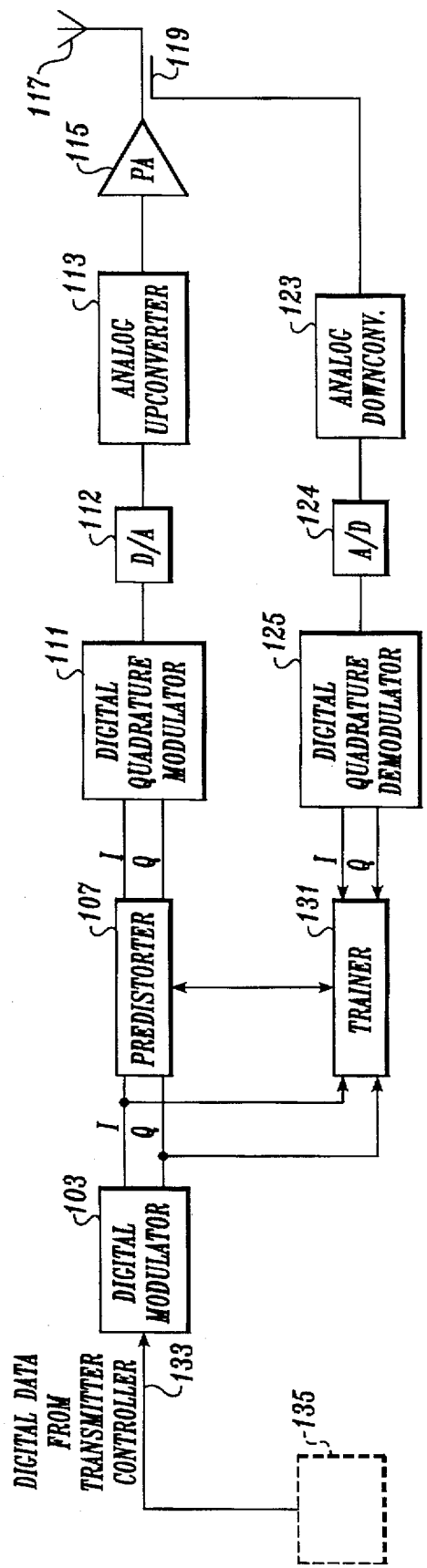
FIG. 1 is a simplified block diagram of one embodiment of a transmitter according to the present invention.

FIG. 1 shows in schematic form one embodiment of a linear transmitter 101 in accordance with the present invention. In the forward signal processing path, the transmitter 101 includes a modulator 103, a predistorter 107, a digital quadrature modulator 111, a digital-to-analog converter 112, an analog upconverter 113, a power amplifier 115 and a transmitting antenna 117. A feedback loop of the transmitter includes a directional coupler 119 (between the power amplifier 115 and the antenna 117), an analog downconverter 123, an analog-to-digital converter 124, a digital quadrature demodulator 125, and a trainer 131. The trainer is coupled to receive the output signals of the digital modulator 103 and interact with the predistorter 107. In other embodiments, additional power amplifiers may be connected in parallel with the power amplifier 115 to increase the gain of the transmitter 101.

Digital data that is to be broadcast by the transmitter 101 is provided to the modulator 103, as represented by line 133. The data may be provided by any source. In a preferred embodiment, the linear transmitter 101 is adapted for use as a paging transmitter, although it can be used in any radio frequency (RF) application. In a preferred embodiment, the data input into the modulator 103 is provided from a transmitter controller 135 (shown in broken lines) that is operative to receive data over a link channel from a paging terminal and formulate the data for transmission. The details of the construction of a transmitter controller, and indeed an entire paging system, can be found in U.S. Pat. No. 5,481,258 to Fawcett et al., U.S. Pat. No. 5,365,569 to Witsaman et al. and U.S. Pat. No. 5,416,808 to Witsaman et al., commonly assigned to the assignee of the present invention and incorporated herein by reference.

In a preferred embodiment, the data is a series of digital symbols, with each symbol representing a predetermined number of bits. The number of bits per symbol is dependent upon the particular modulation scheme being transmitted by the transmitter 101. Modulation formats in typical conventional paging data systems include formats such as, for example, two or four tone frequency shift keying (FSK) modulation and QAM. QAM formats include, for example, an eight level QAM modulation scheme that would have a three-bit symbol. Similarly, a sixteen level QAM scheme would have four bits per symbol. It can be appreciated that for a three-bit symbol, there are eight possible symbols. Likewise, for a four-bit symbol, there are sixteen possible symbols. Throughout most of this discussion, the example used will be of a four-bit symbol, which corresponds to a sixteen level QAM scheme.

The modulator 103 is operative to correlate each particular symbol with predetermined in-phase and quadrature output signals. Thus, for each unique symbol, a different combination of in-phase and quadrature component signals for the base band signal is output by the modulator. In a preferred embodiment, the modulator 103 includes a Texas Instruments TMS320C44 microprocessor that is programmed to perform the in-phase and quadrature modulation on the symbols (described below in conjunction with FIGS. 3 and 4).

Additionally, as each symbol is processed, the modulator 103 does not "instantaneously" transition from one symbol to another. Such an instantaneous change in in-phase and quadrature output signals would result in high frequency harmonics in the system. Instead, by means of digital filtering, a smooth transition between symbols (and therefore in-phase and quadrature output signals) is achieved. One embodiment of this technique which is applicable to an FSK system is disclosed in more detail in U.S. Pat. No. 5,418,818 to Marchetto et al., assigned to the same assignee as the present invention and incorporated herein by reference.

Next, the in-phase and quadrature component signals output by the modulator 103 are input into the predistorter 107. The predistorter 107 is operative to modify the in-phase and quadrature component signals output from the modulator 103 so as to compensate for any distortion that takes place in the power amplifier 115. The compensation provided by the predistorter 107 is controlled by the trainer 131 using any suitable predistortion scheme. The trainer 131 is described in more detail below.

The output of the predistorter 107 is then provided to the digital quadrature modulator 111. The digital quadrature modulator 111 converts the in-phase and quadrature component signals into a single real digital signal. The real digital signal from the digital quadrature modulator 111 is received by a D-A converter 112 that converts the real digital signal to an analog signal, producing an intermediate frequency output signal. For example, the intermediate frequency is approximately 5.6 MHz in a representative embodiment. Because a single D-A converter is used, the distortion caused by the relative delay and amplitude differences introduced in those conventional systems that use separate D-A for in-phase and quadrature signals is substantially eliminated in the transmitter 101.

The intermediate frequency output signal from the D-A converter 112 is provided to the analog upconverter 113, which converts the intermediate frequency signal to a broadcast frequency signal having a frequency within a frequency band of the paging system. For example, the broadcast frequency is approximately 940 MHz in a representative embodiment. The analog upconverter 113 can be any suitable conventional upconverter such as, for example, a mixer receiving a local oscillator signal.

The power amplifier 115 receives the broadcast frequency signal from the analog upconverter 113, amplifies the signal, and provides the amplified signal to the transmitting antenna 117 for transmission. The power amplifier 115 can be any suitable power amplifier such as, for example the power amplifier disclosed in copending and cofiled application [attorney docket number GLENPW-1-8884], assigned to the same assignee as the present invention and incorporated herein by reference. In a representative embodiment, four such power amplifiers are used in parallel, but fewer or more can be used in other configurations.

In order to aid in the accurate predistortion of the signal, the feedback loop monitors the amplified signal from the power amplifier 115. In a preferred embodiment, the coupler 119 is a conventional directional coupler positioned relatively close to the antenna 117. The signal from the coupler 119 is provided to the analog downconverter 123.

The analog downconverter 123 operates in an opposite manner to the analog upconverter 113. In particular, the analog downconverter 123 lowers the frequency of the receive signal outputted by power amplifier 115 to an intermediate frequency. In a preferred embodiment, this intermediate frequency is substantially the same as the intermediate frequency used in the forward signal processing path. Within the analog downconverter 123, there is a series of filtering, amplification, and mixing with local oscillator signals to generate the intermediate frequency signal.

Next, the intermediate frequency signal is converted from an analog intermediate frequency signal into a digital signal. This is accomplished by using a conventional A-D converter 124 such as, for example, an Analog Devices AD9026, which samples the intermediate frequency signal and outputs a digital signal representing the sampled intermediate frequency signal. The digital quadrature demodulator 125 performs a digital quadrature demodulation of the digital signals and outputs the in-phase component signal and the quadrature component signal.

The trainer 131 receives the output signals of the digital quadrature demodulator 125. The trainer 131 also receives the output signals from the modulator 103. Some predistortion algorithms also require the trainer 131 to receive the output signals from the predistorter 107. Thus, in effect, the trainer 131 receives the exact modulated signal that was intended to be sent (the output signals of the modulator 103) and the signal that was transmitted (the output signals of the digital quadrature demodulator 125) in order to ensure that the predistorter 107 correctly compensates for the distortion caused by the power amplifier 115. The trainer 131 and the predistorter 107 can implement any suitable predistortion scheme such as, for example, the scheme disclosed in U.S. Pat. No. 5,049,832 to Cavers. Typically, the trainer provides one or more "trainer" signals to the predistorter that modify the predistorter's response to the in-phase and quadrature signals input to the predistorter.

In addition, the trainer monitors the actual data or voice signals being transmitted to implement the predistortion scheme, as opposed to special sequences (i.e., not normal data or voice signals) as required by some conventional systems. Thus, normal data or voice transmissions need not be interrupted to transmit special data sequences to update the predistorter as in these conventional systems.

Figure 2:
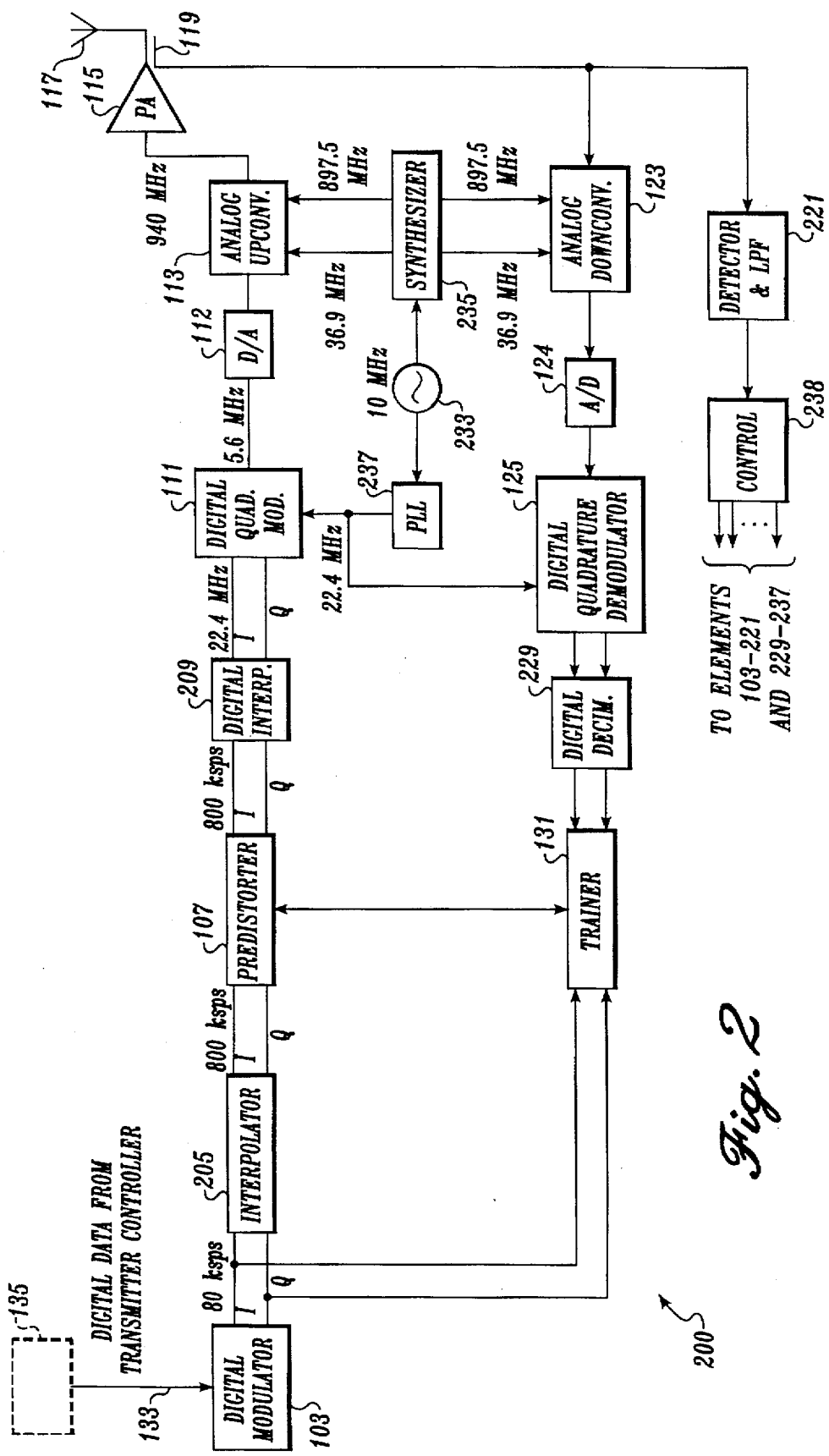
FIG. 2 is a block diagram of a second embodiment of a transmitter according to the present invention.

FIG. 2 is a block diagram of a transmitter 200 according to another embodiment of the present invention. The transmitter 200 is substantially similar to the transmitter 101 (FIG. 1), except that the transmitter 200 includes an interpolator 205 connected between the modulator 103 and the predistorter 107, a digital interpolator 209 connected between the predistorter 107 and the digital quadrature modulator 111, a digital decimator 229 connected between the trainer 131 and the digital quadrature demodulator 125, a combined detector and low pass filter 221 connected to the coupler 119, and a controller 238 connected to the detector and low pass filter 221. The output signals of the controller 238 are provided to components 103–221 and 229–237 as described below. In addition, the transmitter 200 includes a synthesizer 235 connected to the analog upconverter 113 and the analog downconverter 123, a phase locked loop (PLL) 237 connected to the digital quadrature modulator 111. An ovenized reference oscillator 233 is connected to both the synthesizer 235 and the PLL 237.

The transmitter 200 operates in substantially the same manner as the transmitter 101 (FIG. 1). In this embodiment, the output signals of the modulator 103 are the in-phase and quadrature component signals sampled at 80,000 samples per second (80 ksps). A preferred embodiment of the modulator 103 is described below in conjunction with FIG. 3.

The in-phase and quadrature component signals output by the modulator 103 are received by the interpolator 205. The interpolator 205 operates to increase the effective sampling rate of the received signals by means of digital interpolation. In a preferred embodiment, the interpolator 205 outputs the in-phase and quadrature component signals at a rate of approximately 800 ksps and is implemented with a DSP module (described below in conjunction with FIG. 4).

Next, the signals output from the interpolator 205 are input into the predistorter. The predistorter 107, as previously described, predistorts the received in-phase and quadrature component signals to compensate for the distortion of the power amplifier 115. The predistorted 800 ksps component signals from the predistorter 107 are received by the digital interpolator 209. The digital interpolator 209 operates in a fashion similar to the interpolator 205. In particular, the digital interpolator 209 converts the sampling rate to a higher rate. Specifically, both the in-phase and quadrature component signals are first upconverted in a first step by a factor of two. Thus, after this first conversion, the effective sampling rate of the component signals is approximately 1.6 Msps. The signals are then upconverted by another factor of two, resulting in an effective rate of approximately 3.2 Msps. Next, these two 3.2 Msps signals are passed to a further interpolator which upconverts them by a factor of seven to approximately 22.4 Msps. Thus, the output signals of the digital interpolator 209 are in-phase and quadrature component signals that have been sampled at 22.4 Msps. The interpolation stages include digital filtering of the base band signals. The implementation of the digital interpolator 209 is described further below in conjunction with FIG. 5.

The digital quadrature modulator 111 receives the output signals of the digital interpolator 209 and modulates them as previously described using a digital quadrature modulation scheme. In this embodiment, the digital quadrature modulator 111 uses a digital equivalent of a conventional double balanced modulation scheme in conjunction with a 5.6 MHz carrier signal derived from a 22.4 MHz signal provided by the PLL 237. The real digital modulated output signal is then converted to an analog signal by the D-A converter 112. As a result, the D-A converter 112 outputs a 5.6 MHz analog intermediate frequency signal to the analog upconverter 113.

The analog upconverter 113 receives two local oscillator signals provided by the synthesizer 235. In a preferred embodiment, where the broadcast frequency is 940 MHz, the two frequencies provided by the synthesizer 235 are a 36.9 MHz local oscillator signal and a 897.5 MHz local oscillator signal. The analog upconverter 113 receives the local oscillator signals for mixing with the 5.6 MHz intermediate frequency signal in a conventional two-stage mixing scheme. In the first stage of the upconversion, the intermediate signal is mixed with the 36.9 MHz local oscillator signal, and the upper side band of the resulting 42.5 MHz signal is amplified and bandpass filtered before being mixed with the 897.5 MHz local oscillator signal. The resulting upper side band at 940 MHz is bandpass filtered and provided to the power amplifier 115. It can be appreciated that to change the frequency of transmission of the transmitter 101, the local oscillator frequencies of synthesizer 235 can be changed. The 940 MHz signal is then amplified by the power amplifier 115 and broadcast through antenna 117 as previously described for transmitter 101 (FIG. 1).

In a preferred embodiment, the synthesizer 235 is a Phillips SA7025 synthesizer chip. As noted above, the synthesizer 235 controls the variable local oscillator signal for precisely determining the transmit frequency of the signal. The synthesizer 235 uses a reference oscillator 233 that, in a preferred embodiment, is a stable reference at 10 MHz. In a preferred embodiment, this 10 MHz stable reference is obtained from the transmitter controller of a paging base station.

The analog upconverter 113 also includes a conventional variable attenuator which can be controlled by the controller 238. The variable attenuator can be any suitable variable attenuator such as, for example, a PIN diode attenuator. Likewise, the analog downconverter 123 also includes a conventional variable gain amplifier such as, for example, a model AD603 amplifier from Analog Devices. The gain of this amplifier is controlled by the controller 238. The controller 238 is described further below in conjunction with FIG. 6. As a result, the controller 238 can maintain substantially constant power amplifier output power, as described below in conjunction with the flow diagram depicted in FIG. 7.

In the average power monitoring path, the combined detector and low pass filter 221 measures the average signal strength and provides a signal indicative of the average signal strength to the controller 238. The detector 221 can be any suitable average power detector such as, for example, a conventional calibrated diode detector. The controller 238 also receives input signals from the modulator 103 and from the digital decimator 229. By analyzing the signals received from these sources, the controller 238 can determine if any of the system components are malfunctioning. For example, if the output signal of the detector 221 indicates a drop in average signal strength, and the output signals of the modulator 103 remain relatively constant, then a malfunction in the upconversion chain (103-119) is indicated. The detector 221 and controller 238 can also be used to monitor and calibrate the gain of the power amplifier 115.

Referring back to the feedback path, as described above, the 940 MHz receive signal from the coupler 119 is provided to the analog downconverter 123, converted to the intermediate frequency of 5.6 MHz, and received by the digital quadrature demodulator 125. The digital quadrature demodulator 125 operates as previously described for the transmitter 101 (FIG. 1), producing in-phase and quadrature component signals at 22.4 Msps. In a preferred embodiment, the digital quadrature demodulator is implemented using a Xilinx 4003 field programmable gate array (FPGA) that has been configured to perform the digital quadrature demodulation.

The digital decimator 229 receives the output signals of the digital quadrature demodulator 125 and performs a decimation by a factor of twenty-eight to produce 800 ksps complex base band signals. The downconversion is performed, in a preferred embodiment, by two Harris HSP43220 decimating filter chips programmed to decimate by twenty-eight and to filter the base band signals.

The 800 ksps complex base band signals are received by the trainer 131. As previously described, the trainer analyzes the receive signals and the signals from the modulator 103 to control the predistorter 107 to properly compensate for the distortion caused by the power amplifier 115. The output signals of the predistorter 107 may be received by the trainer 131 as required by the particular predistortion scheme being used.

Another important feature of the present invention is that all of the processing done by each of the components of FIG. 2 is keyed off synchronous clock signals. By utilizing the same clocking in the demodulation scheme of components 123-131 and 205-209, as is used in the modulation scheme of components 103-113 and 229, it is possible to monitor the transmitted signal quality on each digital sample. The modulation and demodulation are phase locked to one another with adjustment only needed for the delay through the analog and digital stages, including the power amplifier 115.

Figure 3:
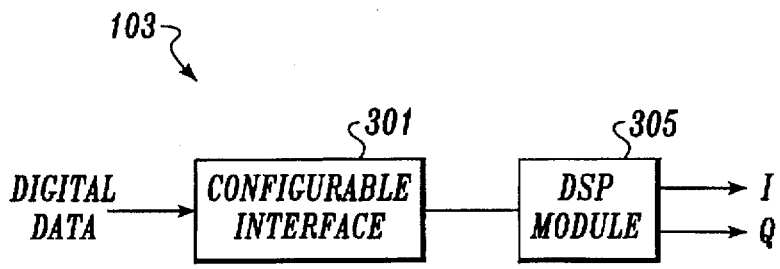
FIG. 3 is a block diagram of one embodiment of a modulator according to the present invention.

FIG. 3 is a block diagram of one embodiment of the modulator 103 according to the present invention. The modulator 103 includes a configurable interface 301, implemented with a reprogrammable logic device, to receive digital signals from the base station controller 135 (FIG. 2). In a preferred embodiment, the reprogrammable logic device is a Xilinx XC4003 field programmable gate array (FPGA), although any suitable reprogrammable logic device can be used. As a result, the configurable interface 301 can be configured to operate with various transmitter controllers. The configurable interface 301 is connected to the DSP module 305 (described below in conjunction with FIG. 4), which receives real digital signals from the interface 301 and converts them into filtered complex digital signals. The DSP module 305 is programmed to produce the in-phase and quadrature component signals from the digital signal received by the configurable interface 301. Additional DSP modules substantially similar to DSP module 305 in hardware implementation may be used to implement a more complex modulation algorithm or to increase the speed of the modulator.

Further, the digital modulator 103 may be programmed to delay incoming signals from the transmitter controller 135 (FIG. 2) for use in a transmitter system using one or more transmitters in addition to the transmitter 200 (FIG. 2) to transmit the data signals. This programmed delay is adjusted so that the transmitter 200 will transmit the data signals at substantially the same time as other transmitters that are transmitting the same data signals. This delay scheme is described further in the aforementioned Marchetto patent.

In addition, the digital modulator 103 can be programmed to equalize processing delays within the digital modulator itself that arise when the modulation format is changed. For example, the processing delays within the digital modulator for FSK modulation and for AM single sideband (SSB) voice modulation are different. Consequently, for example, when a first set or packet of data signals are modulated using a relatively slow modulation processing format, followed by a second set of data signals using a relatively fast modulation processing format, the digital modulator 103 may experience a fault as the "fast" data overtakes the "slow" data. This delay scheme is also described further in the Marchetto patent.

Figure 4:
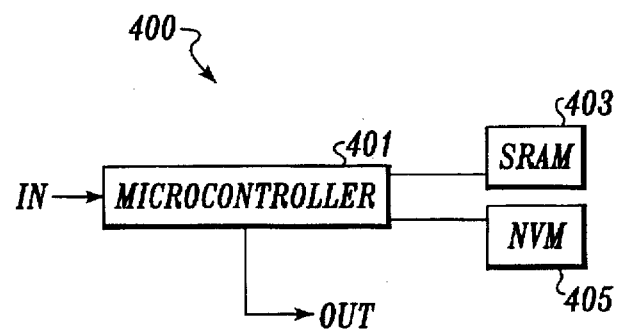
FIG. 4 is a block diagram of one embodiment of a DSP module according to the present invention.

FIG. 4 is a block diagram of one embodiment of a DSP module 400 according to the present invention, substantially identical to DSP module 305 (FIG. 3) in hardware implementation. The DSP module 400 includes a microprocessor 401. In a preferred embodiment, the microprocessor 401 includes a DSP microprocessor TMS320C44 available from Texas Instruments, although any suitable microprocessor can be used. The microprocessor 401 is connected to a static random access memory (SRAM) 403 and a nonvolatile memory 405. In this embodiment, the nonvolatile memory 405 is implemented using a flash electrically programmable read only memory (EPROM). As a result, the DSP module 400 can be configured or programmed for a variety of functions, such as, for example, forming part of a modulator, interpolator, trainer or predistorter. Further, the DSP module 400 can be reprogrammed to change its functionality through the controller 238, which can be programmed to replace the configuration program stored in the nonvolatile memory 405.

In addition, when the trainer 131 and the predistorter 107 are implemented with DSP modules, the DSP modules can be programmed to maintain the maximum dynamic range in the digital signals passing through the D-A and A-D converters in the transmitter 200 (FIG. 2). Maximizing the dynamic range helps maximize the signal-to-noise ratio of the signals passed through the transmitter. However, if the dynamic range is exceeded, the transmitter suffers severe performance degradation. In the D-A converter, exceeding the dynamic range causes so called "wrap-around" of the output analog signal. Thus, for example, when the D-A converter receives a maximum amplitude signal that exceeds the dynamic range, the digital signal detected by the D-A converter will "wrap-around" to a value near the minimum value, causing the analog output signal have a very small amplitude. Similarly, a minimum value signal exceeding the dynamic range will result in an analog output signal at near the maximum amplitude. In the A-D converter, exceeding the dynamic range will result in clipping of high amplitude signals. The predistorter can be programmed to maintain a maximal dynamic range as described in more detail below in conjunction with FIG. 8.

Still further, the DSP module 400 can be remotely reconfigured by remotely communicating reconfiguration information to the controller 238 (FIG. 2). For example, the controller 238 includes a port that can be coupled to an external communication means, such as a modem coupled to a telephone line. Thus, the controller 238 can receive reconfiguration information transmitted over the telephone lines and send this information to the DSP module to be stored in the nonvolatile memory 405. Of course, in other embodiments the controller 238 can remotely receive the configuration information through other remote communication schemes. Thus, in a preferred embodiment, DSP modules substantially similar to the DSP module 400 are used to implement the trainer 131 and predistorter 107 (FIG. 2) so that they can be subsequently reconfigured with updated predistortion algorithms. In addition, this embodiment of the trainer 131 can be programmed so that the trainer 131 can perform a fast Fourier transform (FFT) of the 800 ksps complex base band signals received from the digital decimator 229, thereby producing the spectrum of baseband signals.

Moreover, the DSP module implementing the trainer can also be programmed to compare this spectrum to a mask or envelope of the maximum allowed out-of-band signal levels. If the out-of-band signal levels exceed the maximum allowed, then the DSP module can cause a transmitter disable and reset either directly or by signaling the controller 238 (FIG. 2) to force a shutdown and reset of the transmitter. In FSK embodiments, the trainer can be programmed to monitor the magnitude of the envelope of the transmitted signal. FSK modulation has a constant envelope and, thus, the sum of the squares of the in-phase and quadrature amplitudes of each sample should be equal to the same value. The trainer can be programmed to indicate a fault to the controller 238 when the envelope is not constant.

Further, when implementing the predistorter with a DSP module 400, the predistorter can, on powerdown, store the predistortion values in the nonvolatile memory 405. As a result, the predistorter can use these stored values immediately after power up to predistort data to be transmitted. Thus, the predistorter does not require a special initialization process with special training sequences as required in many conventional systems.

Additionally, the DSP module in the modulator 103 (FIG. 2) can be programmed to scale the in-phase and quadrature output signals at start-up and powerdown to "ramp" the input signals to the power amplifier using a look up table (LUT) containing a smooth ramping function of multiplier factors, thereby reducing transients in the power supply voltages and spurious output signal from the power amplifier. In a preferred embodiment, a Gaussian scaling is used. Smooth ramping can be individually applied to individual subcarriers when more than one is transmitted simultaneously.

Figure 5:
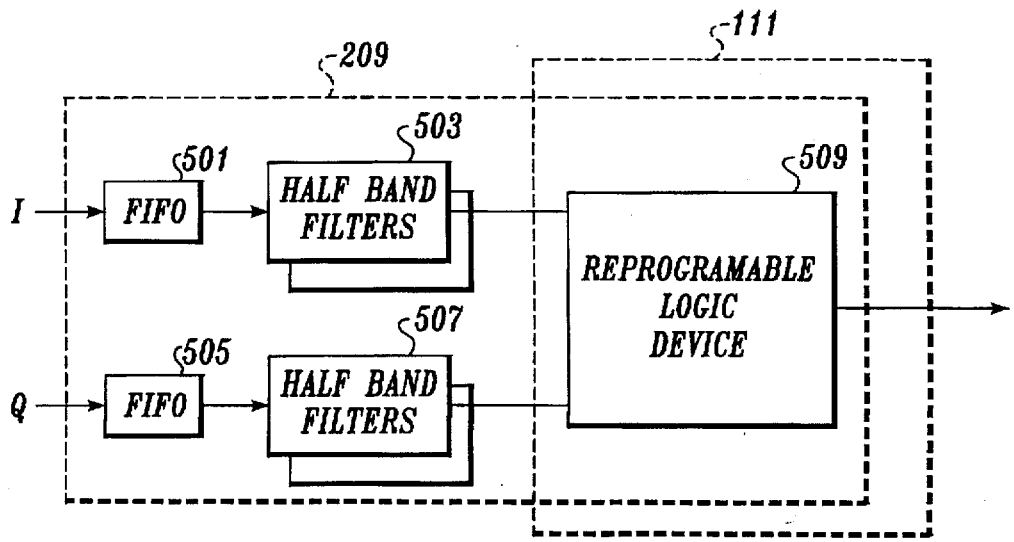
FIG. 5 is a block diagram of one embodiment of a digital interpolator and digital quadrature modulator according to the present invention.

FIG. 5 is a block diagram of one embodiment of the digital interpolator 209 and the digital quadrature modulator 111 according to the present invention. The digital upconverter receives the complex signals from the predistorter 107 (FIG. 2) in FIFOs 501 and 505, which feed two pairs of half band filters 503 and 507. In a preferred embodiment, the two pairs of half band interpolation filters are used to accomplish part of the upconversion from 800 ksps to 3.2 Msps are two pairs of Harris HSP43216 half-band filters, which feed a seven-times interpolator. The seven-times interpolator is implemented by reprogrammable logic device 509 which, in a preferred embodiment, is a Xilinx 4010 FPGA implementing a cascaded integrator/comb (CIC) filter. In addition, the reprogrammable logic device 509 also implements the digital quadrature modulator 111. The D-A converter 112 receives the output signals of the digital quadrature modulator 111 and outputs a real analog intermediate frequency signal corresponding to the real digital signal outputted by the digital quadrature modulator 111. The D-A converter can be any suitable D-A converter, such as, for example, a model DAC600 available from Burr-Brown.

Further, the FPGA can be programmed to monitor check bits that are interleaved in the data of the in-phase and quadrature signals provided by the predistorter and interpolator. In this embodiment, the DSP module implementing the predistorter is programmed to interleave the check bits with the in-phase and quadrature data outputted by the predistorter. The check bits are used to detect if the data flow in the transmitter becomes incorrectly synchronized (e.g., large fields, power surges, static discharge, etc. may cause misclocking between in-phase and quadrature signals). If the in-phase and quadrature signals get out of synch, then the transmitter output signals will be severely distorted. The FPGA of the digital quadrature modulator compares the check bits between corresponding in-phase and quadrature signals and if they do not match, then the digital quadrature modulator causes the transmitter to be disabled and reset, either directly or by signaling the controller 238 (FIG. 2), which then disables and resets the transmitter.

In addition, when the predistorter output signals are correctly clocked, the FIFOs 501 and 505 are approximately half filled. Thus, any overflow or underflow condition in the FIFOs 501 and 505 is indicative of a serious clock fault. Thus, if one or both of the FIFOs indicate an overflow or underflow condition, the digital quadrature modulator again indicates a fault condition to disable and reset the transmitter.

Figure 6:
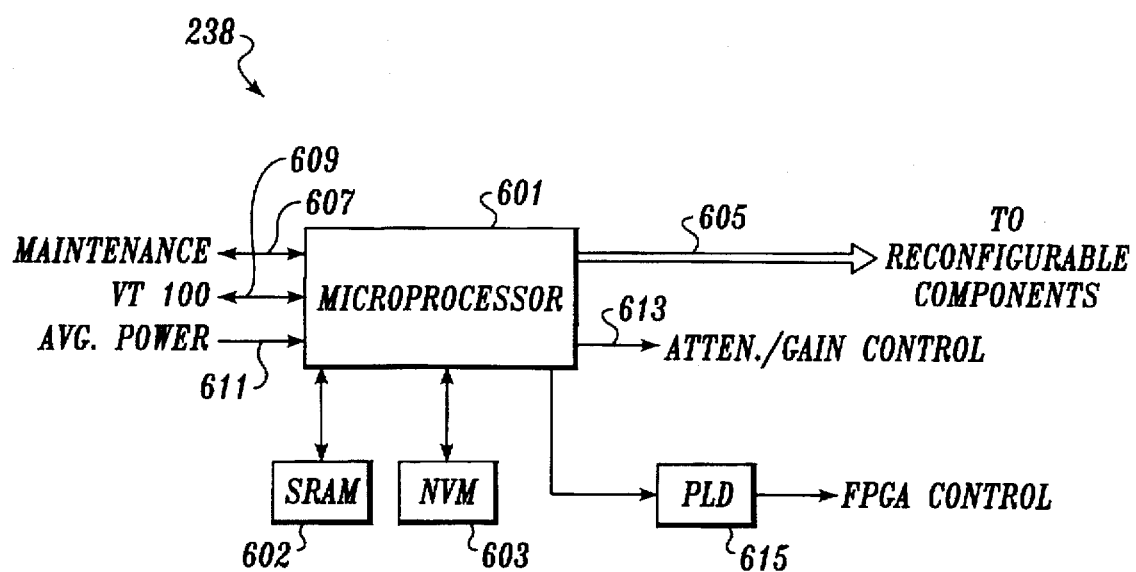
FIG. 6 is a block diagram of one embodiment of a controller according to the present invention.

FIG. 6 is a block diagram of one embodiment of the controller 238 according to the present invention. The controller 238 includes a microcontroller 601 connected to a SRAM 602 and a nonvolatile memory 603. In a preferred embodiment, the microcontroller 601 is a Motorola MC68HC16 microcontroller, although any suitable microcontroller can be used. The microcontroller 601 is connected to a global bus 605, which is also connected to the reconfigurable components of the transmitter 200 (FIG. 2), such as the digital modulator 103, the interpolator 205, the predistorter 107 and the digital decimator 229. The controller 238 provides reconfiguration information to the reconfigurable components through the global bus 605.

The microcontroller 601 also includes a maintenance port 607. The maintenance port can be configured as either an EIA-232 or EIA-422 interface. The maintenance port 607 can be used to receive information from an external source as described in the data sheet for the MC68HC16, which is incorporated herein by reference. Thus, by coupling a remote communication device, such as a modem, to the maintenance port 607, the controller 238 can receive reconfiguration information remotely communicated to the controller, which can be used to reconfigure the various reconfigurable components of the transmitter 200 (FIG. 2). In addition, the microprocessor 601 can receive the FFT information from the trainer 131 (described above in conjunction with FIG. 4) through the global bus 605 and provide this FFT information to the maintenance port 607 for remote monitoring of the transmitted spectrum.

In this embodiment, the microcontroller 601 also includes a port 609 for connecting to a VT100 terminal for monitoring, testing and troubleshooting. In addition, the microcontroller 601 includes input and output ports 611 and 613, respectively, for receiving the average power signals and for adjusting the gain and attenuation of the analog downconverter and analog upconverter, as described above in conjunction with FIG. 2. A programmable logic device (PLD) 615 such as, for example, a ATV2500B PLD is also connected to the microcontroller 601 and provides control signals to the FPGAs in the digital quadrature modulator and the digital quadrature demodulator.

In addition, the microcontroller 601 can be programmed to provide control signals to the digital quadrature modulator 111 and digital quadrature demodulator 125 (FIG. 2) on power up and reset to force synchronization between the digital quadrature modulator 111 and digital quadrature demodulator 125.

Figure 7:
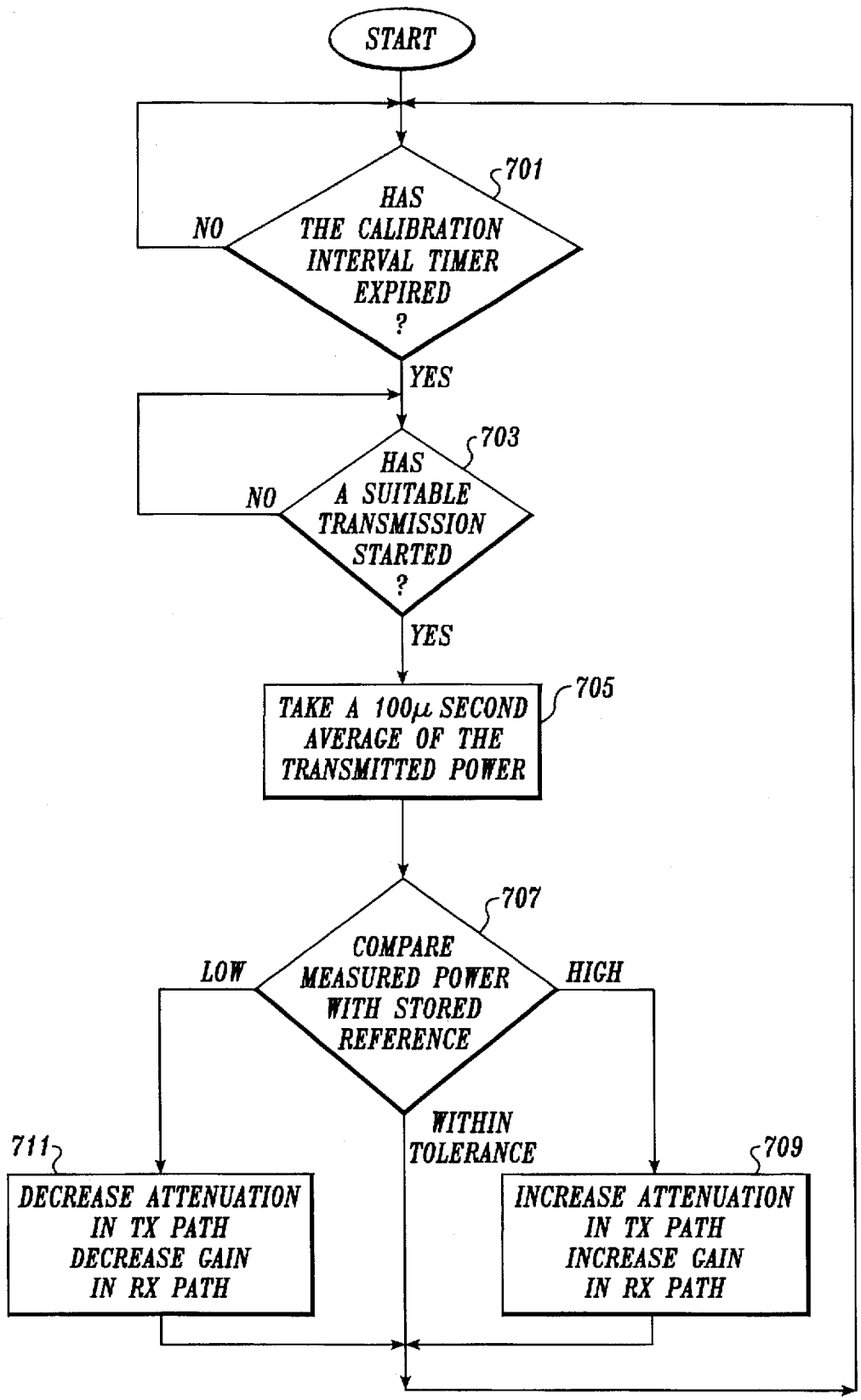
FIG. 7 is a flow diagram illustrating the operation of the controller in automatically adjusting the gain and attenuation of the analog downconverter and analog upconverter, respectively, according to one embodiment of the present invention.

FIG. 7 is a flow diagram illustrating the operation of the controller 238 (FIG. 2) in automatically adjusting the attenuation and gain of the analog upconverter 113 and analog downconverter 123 (FIG. 2). The controller 238 performs this calibration periodically by checking whether a calibration interval timer has expired, as shown in step 701. In a preferred embodiment, the interval is approximately ten minutes. The controller repeats checking the calibration timer until the interval has expired, and then performs a step 703.

In step 703, the controller 238 checks whether the transmitter 200 (FIG. 2) has started a transmission suitable for use in the calibrating process. Suitable transmissions are those that have an approximately constant power level such as, for example, FSK modulated signals. QAM signals can also be suitable. Normal digital data transmissions are typically suitable, although voice transmissions are not. If a suitable transmission has not started, then the controller 238 repeats step 703 until one does begin.

The controller 238 then performs a step 705 where it takes a 100 µs average of the transmitted power. The controller 238, in a next step 707, compares the measured average power with a stored reference. In a preferred embodiment, the stored reference is the average power of a test tone transmitted at the time of manufacture. If the measured average power is greater than the reference, then in a step 709 the controller 238 causes the analog upconverter 113 to increase its attenuation and the analog downconverter 123 to decrease its gain, as described above in conjunction with FIG. 2. In contrast, if the measured average power is less than the reference, then in a step 711 the controller 238 causes the analog upconverter 113 to decrease its attenuation and the analog downconverter 123 to increase its gain. However, if the measured average power is approximately equal to the reference (i.e., within tolerance), then the controller 238 does not modify the attenuation or gain of the analog upconverter or downconverter. The controller 238 then loops back to step 701 to wait for the next calibration interval to expire.

Figure 8:
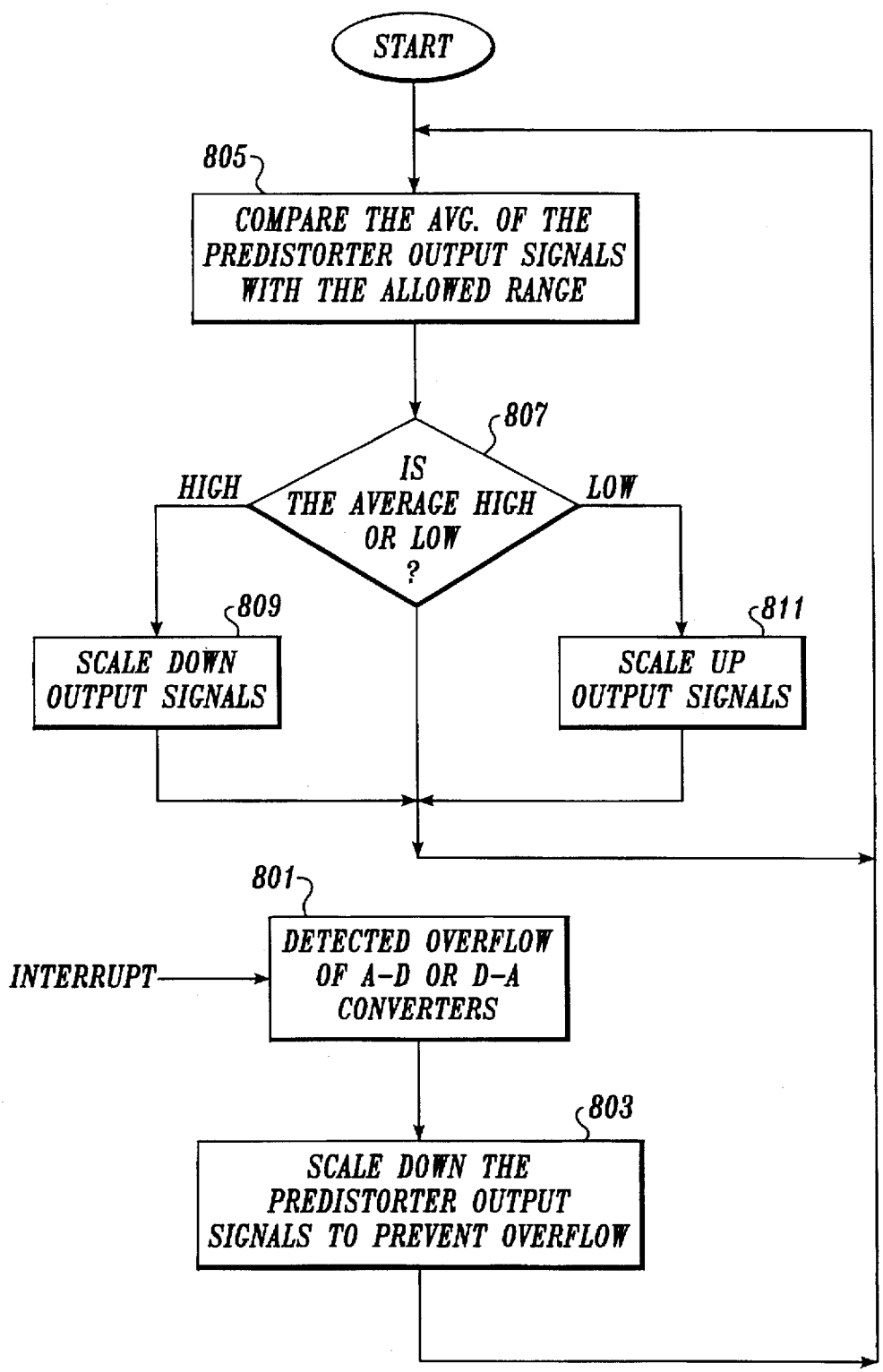
FIG. 8 is a flow diagram illustrating the operation of the predistorter in automatically maintaining a maximal dynamic range of signals passing through the transmitter accord to one embodiment of the present invention.

FIG. 8 is a flow diagram illustrating the operation of the predistorter 107 (FIG. 2) implemented with a DSP module (FIG. 4) in automatically maintaining a maximal dynamic range of signals passing through the transmitter 200 (FIG. 2). The predistorter 107 is coupled to receive an interrupt signal from the digital quadrature modulator 111 and the digital quadrature demodulator 125 whenever an overflow condition has occurred (i.e., the dynamic range has been exceeded). An interrupt causes the predistorter 107 to perform a step 801, indicating an overflow was detected in the A-D converter or the D-A converter (FIG. 2). The predistorter 107 then performs a step 803 to scale down the predistorter output signals to prevent overflow of subsequent signals. Then, in a next step 805, the predistorter 107 compares the average amplitude of the predistorter output signals to the allowed range of the D-A and A-D converters. In a next step 807, an evaluation is made of whether the average amplitude is higher than the allowed range. If so, the predistorter scales its output signals down in a step 809. However, if in step 807 the average amplitude is determined to be lower, then in a step 811 the predistorter scales its output signals up. The predistorter 107 then returns to step 805, repeating the cycle until the next interrupt.

The embodiments of the transmitter described above are illustrative of the principles of the present invention and are not intended to limit the invention to the particular embodiments described. For example, while a preferred embodiment has been described in connection with a paging transmitter, the linear transmitter will find application in many broadcast environments. In addition, the embodiments described above can be adapted for different modulation formats without undue experimentation by those skilled in the art, in light of the present disclosure. For example, voice signals modulated by AM SSB can also be supported, as well as multiple subcarriers of such modulated signals. Accordingly, while a preferred embodiment of the invention has been illustrated and described, it will be appreciated that in light of this disclosure, various changes can be made therein without departing from the spirit and scope of the invention.

The embodiments of the invention in which an exclusive property or privilege is claimed are defined as follows:

1. A transmitter for substantially linearly transmitting signals at a broadcast frequency, the transmitter comprising:
   a digital modulator coupled to receive digital data, wherein said modulator is capable of providing an in-phase signal and a quadrature signal dependent on said digital data;
   a predistorter coupled to said digital modulator, wherein said predistorter is capable of providing a predistorted in-phase signal dependent on said in-phase signal provided by said digital modulator and a predistorted quadrature signal dependent on said quadrature signal provided by said digital modulator;
   a digital quadrature modulator coupled to said predistorter, wherein said digital quadrature modulator is capable of providing a digital predistorted signal dependent on a combination of said predistorted in-phase signal and said predistorted quadrature signal provided by said predistorter;
   a digital-to-analog converter coupled to said digital quadrature modulator, wherein said digital-to-analog converter is capable of providing an analog predistorted signal dependent on said digital predistorted signal provided by said digital quadrature modulator;
   a power amplifier coupled to said digital-to-analog converter, wherein said power amplifier is capable of providing an amplified analog signal dependent on analog predistorted signal provided by said digital-to-analog converter;
   an antenna coupled to said power amplifier, wherein said antenna is capable of broadcasting said amplified analog signal provided by said power amplifier;
   a coupler coupled to said power amplifier, wherein said coupler is capable of providing a receive signal dependent on said amplified analog signal provided by said power amplifier;
   an analog-to-digital converter coupled to said coupler, wherein said analog-to-digital converter is capable of providing a digital receive signal dependent on said receive signal provided by said coupler;
   a digital quadrature demodulator coupled to said analog-to-digital converter, wherein said digital quadrature demodulator is capable of providing a feedback in-phase signal and a feedback quadrature signal dependent on said digital receive signal provided by said analog-to-digital converter;
   a trainer coupled to said digital quadrature demodulator, said predistorter and said digital modulator, wherein said trainer is capable of providing a trainer signal to said predistorter, said trainer signal being dependent on said feedback in-phase signal, said feedback quadrature signal, said in-phase signal, and said quadrature signal, wherein a subsequent predistorted in-phase signal and a subsequent predistorted quadrature signal provided by said predistorter are dependent on said trainer signal and subsequent in-phase and quadrature signals provided by said digital modulator; and
   a controller coupled to said digital modulator, said predistorter, and said trainer, wherein said digital modulator, said predistorter, and said trainer are reconfigurable, said controller being capable of selectably providing reconfiguration signals to said digital modulator, said predistorter, and said trainer, whereby said digital modulator, said predistorter, and said trainer are selectably reconfigured.

2. The transmitter of claim 1 further comprising:
   an analog upconverter coupled between said digital-to-analog converter and said power amplifier, wherein said analog upconverter is capable of providing to said power amplifier a broadcast frequency signal dependent on said analog predistorted signal provided by said digital-to-analog converter; and
   an analog downconverter coupled between said coupler and said analog-to-digital converter, wherein said analog downconverter is capable of providing to said analog-to-digital converter an analog intermediate frequency signal dependent on said receive signal provided by said coupler.

3. The transmitter of claim 2 further comprising an interpolator coupled between said digital modulator and said predistorter, wherein said interpolator is capable of providing an interpolated in-phase signal dependent on said in-phase signal provided by said digital modulator and an interpolated quadrature signal dependent on said quadrature signal provided by said digital modulator.

4. The transmitter of claim 3 further comprising:
   a digital interpolator coupled between said predistorter and said digital quadrature modulator, wherein said digital interpolator is capable of providing an upconverted in-phase signal dependent on said predistorted in-phase signal provided by said predistorter and an upconverted quadrature signal dependent on said predistorted quadrature signal provided by said predistorter; and a digital decimator coupled between said trainer and said digital quadrature demodulator, wherein said digital decimator is capable of providing a downconverted in-phase signal dependent on said feedback in-phase signal provided by said digital quadrature demodulator and a downconverted quadrature signal dependent on said feedback quadrature signal provided by said digital quadrature demodulator.

5. The transmitter of claim 1 wherein said controller is capable of adjusting a gain of said analog intermediate frequency signal provided by said analog downconverter and adjusting an attenuation of said broadcast frequency signal provided by said analog upconverter.

6. The transmitter of claim 1 wherein said controller is adapted to receive reconfiguration information remotely communicated to said linear transmitter.

7. The transmitter of claim 6 wherein said digital modulator, said digital quadrature modulator, and said digital quadrature demodulator each comprise a reprogrammable logic device.

8. The transmitter of claim 7 wherein said digital modulator, said digital quadrature modulator, and said digital quadrature demodulator each comprise a field programmable gate array.

9. The transmitter of claim 8 wherein said transmitter is used in a paging system.

10. The transmitter of claim 9 wherein said digital modulator is capable of smoothly scaling up said in-phase signal and said quadrature signal when said transmitter is being powered up and capable of smoothly scaling down said in-phase signal and said quadrature signal when said transmitter is being powered down.

11. The transmitter of claim 9 wherein said digital modulator is capable, when said transmitter is transmitting multiple subcarrier signals simultaneously, of smoothly ramping up individual subcarrier signals and said transmitter is being powered up and capable of smoothly ramping down said individual subcarrier signals when said transmitter is being powered down.

12. The transmitter of claim 1 further comprising a controller coupled to said digital modulator, said predistorter, and said trainer, wherein said digital modulator, said predistorter, and said trainer are reconfigurable, said controller being capable of selectably providing reconfiguration signals to said digital modulator said predistorter, and said trainer, whereby said digital modulator said predistorter, and said trainer are selectably reconfigured.

13. The transmitter of claim 12 wherein said controller is adapted to receive reconfiguration information remotely communicated to said linear transmitter.

14. The transmitter of claim 3 further comprising a controller coupled to said digital modulator, said interpolator, said predistorter, and said trainer, wherein said digital modulator, said interpolator, said predistorter, and said trainer are reconfigurable, said controller being capable of selectably providing reconfiguration signals to said digital modulator, said interpolator, said predistorter, and said trainer, whereby said digital modulator, said interpolator, said predistorter, and said trainer are selectably reconfigured.

15. The transmitter of claim 14 wherein said controller is capable of adjusting a gain of said analog intermediate frequency signal provided by said analog downconverter and adjusting an attenuation of said broadcast frequency signal provided by said analog upconverter.

16. The transmitter of claim 1 wherein said trainer comprises a microprocessor.

17. The transmitter of claim 16 wherein said microprocessor is programmed to perform a fast Fourier transform of said feed-back in-phase signal and said feedback quadrature signal.

18. The transmitter of claim 16 wherein said predistorter comprises a nonvolatile memory, said predistorter storing predistortion values in said nonvolatile memory during a powerdown and using said stored predistortion values in providing predistorted in-phase and predistorted quadrature signals during a power-up sequentially following said powerdown.

19. The transmitter of claim 8 wherein said predistorter comprises a microprocessor programmed to add matching check bits to said predistorted in-phase signal and said predistorted quadrature signal.

20. The transmitter of claim 19 wherein said field programmable gate array of said digital quadrature modulator is configured to monitor check bits in said upconverted in-phase signal and said upconverted quadrature signal.

21. The transmitter of claim 1 wherein said trainer signal is not dependent on digital data dedicated to training the trainer.

22. The transmitter of claim 1 wherein said digital data does not include data dedicated to training the trainer.

23. A transmitter for substantially linearly transmitting signals at a broadcast frequency, the transmitter comprising:

a modulator for receiving digital data and mapping said digital data into an in-phase signal and a quadrature signal;

an interpolator for increasing the sampling rate of said in-phase and said quadrature signal;

a predistorter that modifies said in-phase and said quadrature signal into a predistorted in-phase signal and a predistorted quadrature signal, respectively;

a digital quadrature modulator that combines said predistorted in-phase signal and said predistorted quadrature signal into a digital predistorted signal;

a digital-to-analog converter that converts the digital predistorted signal into an analog predistorted signal;

an analog upconverter for increasing the frequency of said analog predistorted signal to said broadcast frequency;

a power amplifier that amplifies said analog predistorted signal from said analog upconverter;

an antenna for broadcasting said analog predistorted signal from said power amplifier;

a coupler for receiving a portion of said analog predistorted signal amplified by said power amplifier;

an analog downconverter for decreasing the frequency of said analog predistorted signal received by said coupler;

an analog-to-digital converter that converts the analog predistorted signal from the analog downconverter into a digital predistorted signal;

a digital quadrature demodulator that converts said digital predistorted signal from said analog-to-digital converter into a feedback in-phase signal and a feedback quadrature signal;

a trainer for comparing said feedback in-phase signal and said feedback quadrature signal with said in-phase signal and said quadrature, wherein said trainer modifies said predistorter such that the output of said power amplifier is consistent with said in-phase signal and said quadrature signal; and a controller coupled to said digital modulator, said predistorter, and said trainer, wherein said digital modulator, said predistorter, and said trainer are reconfigurable, said controller being capable of selectably providing reconfiguration signals to said digital modulator, said predistorter, and said trainer, whereby said digital modulator, said predistorter, and said trainer are selectably reconfigured.

24. The transmitter of claim 23 wherein said transmitter is used in a paging system.

25. The transmitter of claim 24 further comprising:
   a digital interpolator for providing an interpolated in-phase signal dependent on said predistorted in-phase signal provided by said predistorter and an interpolated quadrature signal dependent on said predistorted quadrature signal provided by said predistorter; and
   a digital decimator for providing a decimated in-phase signal dependent on said feedback in-phase signal provided by said digital quadrature demodulator and a decimated quadrature signal dependent on said feedback quadrature signal provided by said digital quadrature demodulator.

26. The transmitter of claim 23 wherein said controller is coupled to an external communication means, said controller being capable of receiving reconfiguration information remotely communicated to said linear transmitter.

27. The transmitter of claim 26 wherein said digital modulator, said digital quadrature modulator, and said digital quadrature demodulator each comprise a reprogrammable logic device.

28. The transmitter of claim 27 wherein said digital modulator, said digital quadrature modulator, and said digital quadrature demodulator each comprise a field programmable gate array.

29. The transmitter of claim 28 further comprising one or more additional power amplifiers connected in parallel with said power amplifier, said one or more additional power amplifiers being substantially identical to said power amplifier.

30. The transmitter of claim 23 wherein said controller is capable of adjust a gain of said analog predistorted signal from said analog downconverter and adjusting an attenuation of said analog predistorted signal from said analog upconverter.

31. A method for transmitting substantially linearly transmitting signals at a broadcast frequency, the method comprising:
   receiving digital data to be broadcast;
   mapping said digital data into an in-phase signal and a quadrature signal;
   predistorting said in-phase and said quadrature signal into a predistorted in-phase signal and a predistorted quadrature signal, respectively;
   modulating by digital quadrature modulation said predistorted in-phase signal and said predistorted quadrature signal to provide a digital quadrature modulated signal;
   converting said digital quadrature modulated signal into an analog predistorted signal;
   amplifying said analog predistorted signal to provide an amplified analog predistorted signal;
   broadcasting said amplified analog predistorted signal;
   receiving a portion of said amplified analog predistorted signal to provide a receive signal;
   converting said receive signal into a digital receive signal;
   demodulating by digital quadrature demodulation said digital receive signal to provide a feedback in-phase signal and a feedback quadrature signal;
   providing a trainer signal dependent on said feedback in-phase signal and said feedback quadrature signal, said in-phase signal and said quadrature signal;
   predistorting a subsequent in-phase signal and a subsequent quadrature signal into a subsequent predistorted in-phase signal and a subsequent predistorted quadrature signal, respectively, wherein said subsequent predistorted in-phase signal and said subsequent predistorted quadrature signal are dependent on said trainer signal; and
   receiving remotely communicated reconfiguration information and modifying said predistorting of said in-phase and said quadrature signal into said predistorted in-phase signal and said predistorted quadrature signal, respectively.

32. The method of claim 31 further comprising:
   interpolating said in-phase and said quadrature signal after mapping said digital data into said in-phase signal and said quadrature signal;
   increasing the frequency of said analog predistorted signal to a broadcast frequency to provide a broadcast frequency analog predistorted signal before amplifying said analog predistorted signal to provide said amplified analog predistorted signal; and
   decreasing the frequency of said receive signal to provide an intermediate frequency receive signal after receiving said portion of said amplified analog predistorted signal to provide said receive signal.

33. The method of claim 32 further comprising:
   receiving said predistorted in-phase signal and said predistorted quadrature signal and providing an interpolated in-phase signal dependent on said predistorted in-phase signal and an interpolated quadrature signal dependent on said predistorted quadrature signal; and
   receiving said feedback in-phase signal and said feedback quadrature signal and providing a decimated in-phase signal dependent on said feedback in-phase signal and a decimated quadrature signal dependent on said feedback quadrature signal.

34. The method of claim 33 further comprising:
   receiving remotely communicated reconfiguration information;
   modifying said modulation by digital quadrature modulation of said predistorted in-phase signal and said predistorted quadrature signal in response to said reconfiguration information; and
   modifying said demodulation by digital quadrature demodulation of said digital intermediate frequency receive signal in response to said reconfiguration information.

35. The method of claim 32 further comprising adjusting an attenuation of said broadcast frequency analog predistorted signal and adjusting a gain of said intermediate frequency receive signal.

* * * * *